United States Patent [19]
Allpress et al.

[11] Patent Number: 5,694,079
[45] Date of Patent: Dec. 2, 1997

[54] DIGITAL FM DEMODULATOR USING A LAGRANGIAN INTERPOLATION FUNCTION

[75] Inventors: Stephen A. Allpress, Randolph; Roy Baxter Blake, Denville, both of N.J.

[73] Assignee: Lucent Technologies Inc., Murray Hill, N.J.

[21] Appl. No.: 628,223

[22] Filed: Apr. 4, 1996

[51] Int. Cl.$^6$ ................................................ H03D 3/00
[52] U.S. Cl. .................... 329/327; 329/341; 375/324; 455/214
[58] Field of Search ............................ 329/302, 308, 329/309, 315, 323, 327, 341, 343; 375/324, 326; 455/214

[56] References Cited

U.S. PATENT DOCUMENTS

| | | | |
|---|---|---|---|
| 4,736,392 | 4/1988 | Kammeyer et al. | 375/324 |
| 4,862,099 | 8/1989 | Nakai et al. | 329/318 |
| 4,885,546 | 12/1989 | Araki | 329/341 |
| 4,910,469 | 3/1990 | Takahashi | 329/320 |
| 5,052,050 | 9/1991 | Collier et al. | 329/327 |
| 5,220,583 | 6/1993 | Solomon | 329/315 |
| 5,404,589 | 4/1995 | Bijker et al. | 455/200.1 |

Primary Examiner—Siegfried H. Grimm

[57] ABSTRACT

In a preferred embodiment, an FM demodulator includes an I and Q sampler for generating data samples of I and Q signals of an FM signal. A signal processor derives samples of a modulating waveform of the FM signal from the I and Q data samples, using a Lagrangian interpolation function of the I and Q data samples. Variables include derivatives of the I and Q signals obtained by differentiation of the Lagrangian function. Preferably, the processor further utilizes a correction factor to correct the modulating waveform samples obtained from the Lagrangian-based interpolation, to thereby derive a modulating waveform exhibiting low signal distortion.

20 Claims, 6 Drawing Sheets

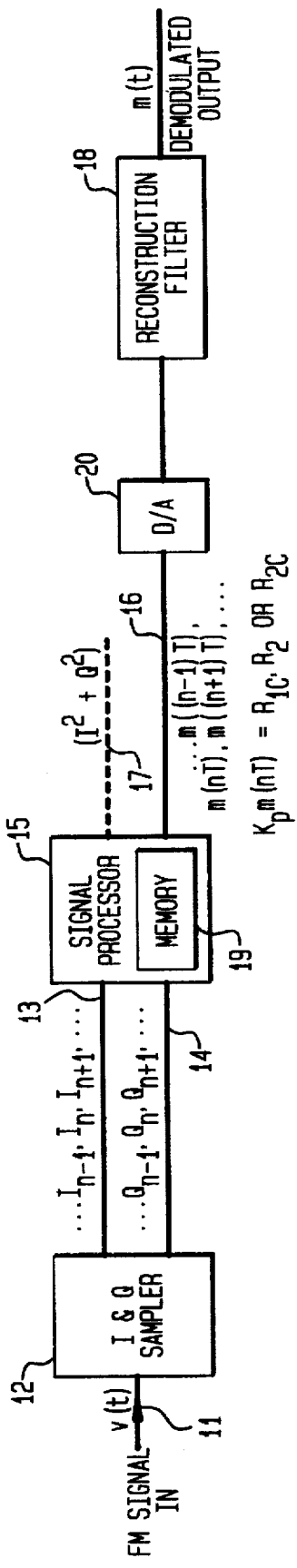
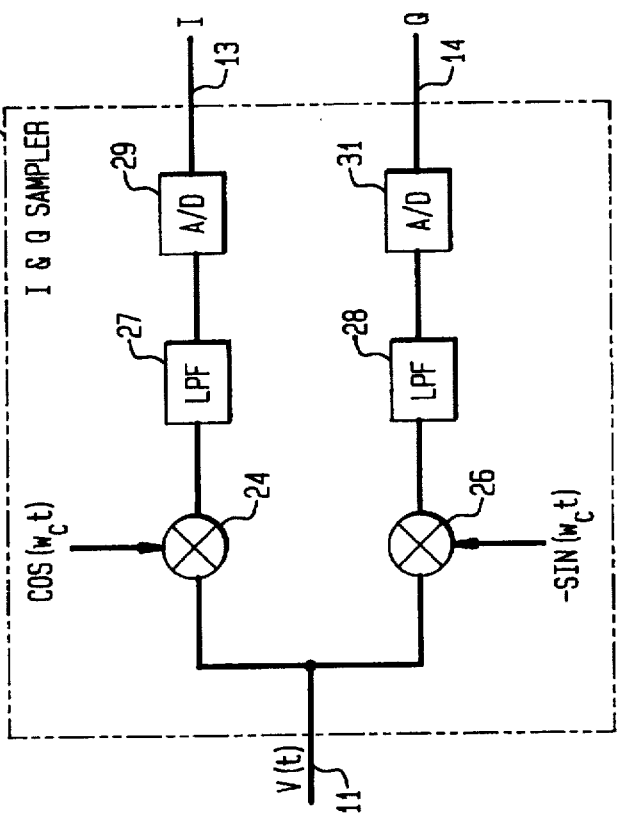
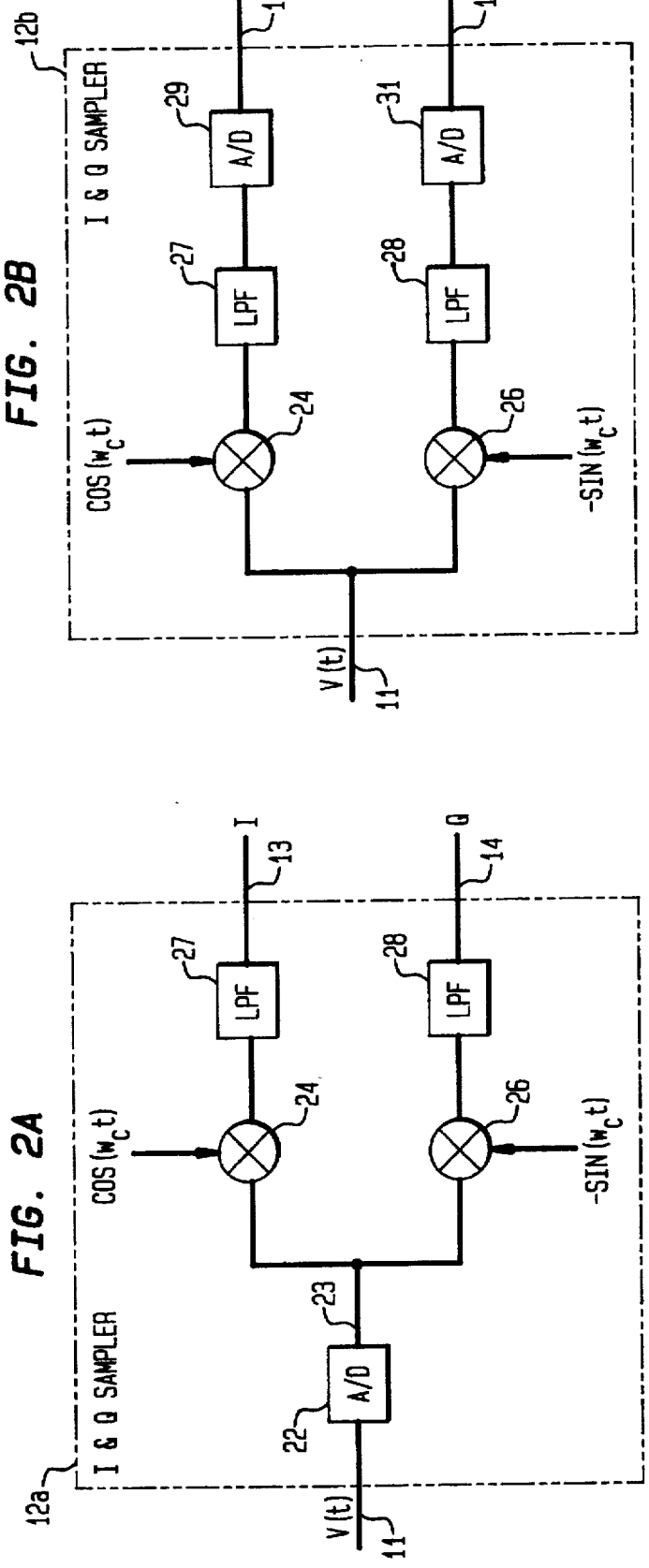

DIGITAL FM DEMODULATOR USING A LAGRANGIAN INTERPOLATION FUNCTION

FIELD OF THE INVENTION

The present invention relates generally to apparatus and methods for demodulation of a frequency-modulated (FM) signal, and in particular, to a computationally efficient, low distortion demodulation of a digitally sampled FM signal.

BACKGROUND OF THE INVENTION

Frequency modulation ("FM") is widely used in radio broadcasting as well as in a variety of other applications such as wireless telecommunications and musical recording. In FM systems, a sine-wave carrier is modulated so that its instantaneous frequency differs from the carrier frequency by an amount that is proportional to the instantaneous amplitude of the modulating wave. The modulated carrier is then demodulated at its destination.

A relatively modern method of demodulating an FM signal is generally referred to as digital FM demodulation. With this method, the FM signal to be demodulated is applied to an analog to digital (A/D) converter where it is sampled at a periodic rate. The sampled FM signal is then typically separated into time varying in-phase (I) and quadrature-phase (Q) signals, where the Q signal is the I signal delayed in phase by 90° at the carrier frequency. A digital signal processor is then employed to recover the modulating wave of the FM signal from the sampled I and Q signals.

Conventionally, the digital signal processor recovers the modulating wave by computing the function $$F(t) = \frac{d}{dt}\tan^{-1}(Q(t)/I(t)). \qquad (1a)$$

From a computational standpoint, this approach has several disadvantages resulting in increased processing time and/or signal processor complexity. One drawback is that the evaluation of the arctangent function either requires a look-up table, or the use of an approximation algorithm. Moreover, differentiation of the arctangent function requires mapping of the output to the correct quadrant.

Accordingly, since it is desirable to keep signal processor complexity to a minimum in digital FM applications, there exists a need for computationally efficient processing of the time sampled I and Q signals to recover the information within the FM signal.

SUMMARY OF THE INVENTION

Embodiments of the present invention can provide computationally efficient, digital FM demodulation with low signal distortion. In a preferred embodiment, an FM demodulator includes an I and Q sampler for generating data samples of I and Q signals of an FM signal. A signal processor derives samples of a modulating waveform of the FM signal from the I and Q data samples, using a Lagrangian interpolation function of the I and Q data samples. Variables include derivatives of the I and Q signals obtained by differentiation of the Lagrangian function. Preferably, the processor further utilizes a correction factor to correct the modulating waveform samples obtained from the Lagrangian-based interpolation, to thereby derive a modulating waveform exhibiting low signal distortion.

BRIEF DESCRIPTION OF THE DRAWINGS

For a full understanding of the present invention, reference is had to exemplary embodiments thereof, considered in conjunction with the accompanying drawings like reference numerals depict like elements or features, for which:

FIG. 1 is a block diagram of an embodiment of an FM demodulator in accordance with the present invention;

FIGS. 2A and 2B show configurations for the I and Q sampler of FIG. 1;

DETAILED DESCRIPTION OF THE PREFERRED EMBODIMENTS

Figure 3:
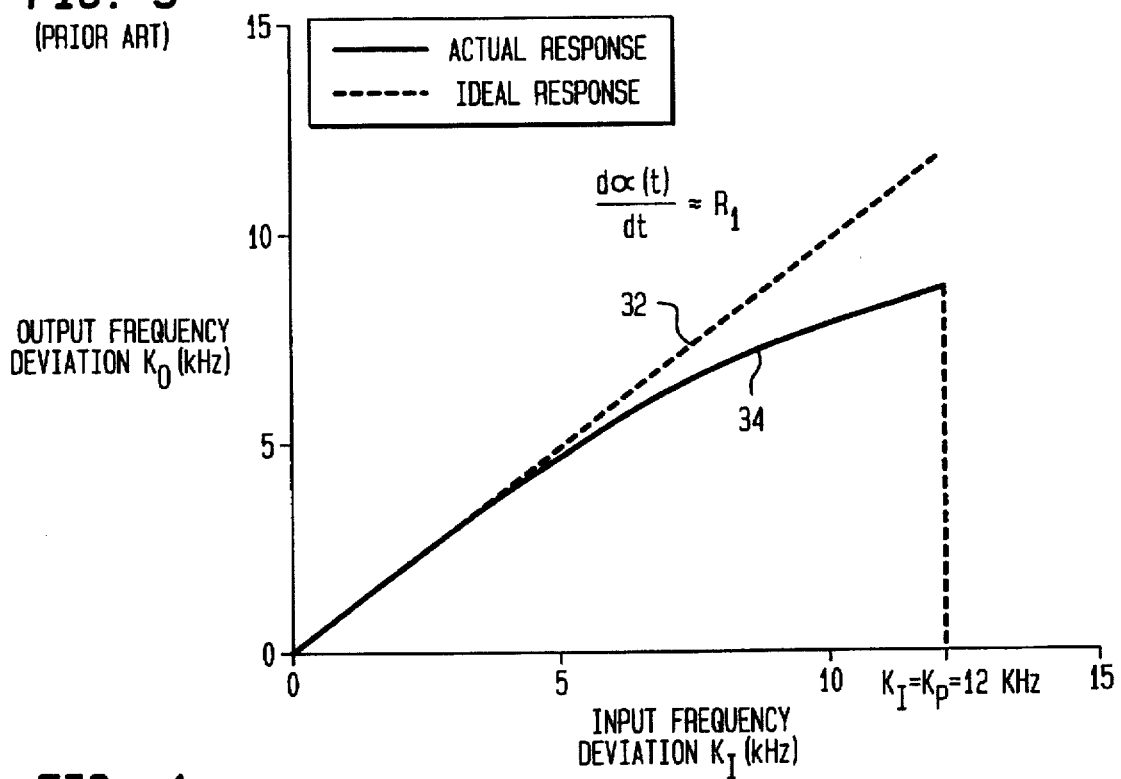
FIGS. 3 and 4 show performance curves for a prior art FM demodulator.

FIG. 1 illustrates a block diagram of an exemplary embodiment of an FM demodulator in accordance with the present invention, designated generally as 10. Demodulator 10 may form a portion of a receiver in a wireless telecommunications system, e.g., as part of a base station receiver in a cellular system. It is understood that demodulator 10 may also be employed within other types of FM systems.

An input FM signal v(t) to be demodulated is applied to input line 11 of I & Q sampler 12. I & Q sampler 12 provides a sampled data in-phase (I) component of v(t) on line 13 and a sampled data quadrature-phase (Q) component of v(t) on line 14. The sampled data I and Q components are data streams ... $I_{n-1}, I_n, I_{n+1}, \ldots$ and ... $Q_{n-1}, Q_n, Q_{n+1} \ldots$, respectively, where successive data samples within each data stream such as $I_n, I_{n+1}$ are spaced from one another in time by T seconds.

Suitable circuit configurations for I & Q sampler 12 are well-known in the art. FIG. 2A shows an exemplary I & Q sampler, designated generally as 12a. The FM signal v(t) is sampled by A/D converter 22 to provide a sampled FM signal on line 23. Sampling is performed in a periodic manner and a sufficiently high sampling rate to avoid loss of signal information. The sampled FM signal is applied to each of first and second multipliers 24 and 26, respectively, which multiply the signal by respective functions $\cos(\omega_c t)$ and $-\sin(\omega_c t)$ in which $\omega_c$ is the carrier frequency (in rads$^{-1}$) of the FM signal v(t). The multiplied outputs are filtered by respective low pass filters 27 and 28 to provide the sampled data I and Q signals on output lines 13 and 14, respectively.

FIG. 2B depicts an alternative configuration for the I & Q sampler, designated generally as 12b. The analog FM signal v(t) is applied to each of multipliers 24 and 26, where the signal is multiplied by $\cos(\omega_c t)$ and $-\sin(\omega_c t)$ functions, respectively. The multiplied outputs are filtered by filters 27 and 28 and then sampled by respective A/D converters 29 and 31 to provide the sampled data I and Q signals.

Referring again to FIG. 1, the sampled data I and Q signals on respective lines 13 and 14 are applied to signal processor 15, which reconstructs the modulating wave ... m((n−1)T), m(nT), m((n+1)T), . . . , where m(t) denotes the modulating wave of the FM signal v(t). The sampled m(nT) data stream is then applied to the digital-to-analog (D/A) converter 20, which provides the demodulated analog output signal m(t) on line 21. If desired, the output signal can be applied to a standard reconstruction filter, 18, to smooth out the signal. Optionally, memory, 19, can be incorporated in the signal processor to store the completely sampled modulating waveform for subsequent conversion by D/A converter 20 when needed.

In wireless telecommunications and other applications, signal processor 15 also provides a sampled data signal on line 17, corresponding to ($I^2+Q^2$), which is indicative of the power level of the received FM signal and therefore provides a useful Received Signal Strength Indicator (RSSI).

To provide a foundation for the signal processing of the sampled data I & Q signals by signal processor 15 to obtain m(t), certain aspects of FM signals will first be presented. In general, an FM signal v(t) may be expressed as:

$$v(t) = V_m \cos[\omega_c t + \phi(t)], \quad (1)$$

where v(t) is the RF voltage, $V_m$ is the amplitude of the RF carrier, and $$\phi(t) = K_P \int_{-\infty}^{t} m(\tau)d\tau, \quad (2)$$

where m(t) is the modulating waveform or message signal and $K_P$ is the peak frequency deviation in rads$^{-1}$/volt. The RF bandwidth "BW" of this signal can be estimated using the well-known Carson's role, which states that:

$$BW = 2K_p f_b \quad (3)$$

where $f_b$ is the highest frequency component present in the baseband message signal, m(t).

To demodulate a received FM signal v(t), one can first exponentially modulate v(t) to provide a complex signal u(t), defined by:

$$u(t) = v(t)e^{-j\omega_c t}. \quad (4)$$

The real and imaginary, or in-phase (I(t)) and quadri-phase (Q(t)) components, respectively, of the signal u(t), are:

$$I(t) = v(t) \cos[\omega_c t]; \quad (5a)$$

$$Q(t) = -v(t) \sin[\omega_c t]; \quad (5b)$$

Accordingly, by employing the multiplicands $\cos(\omega_c t)$ and $-\sin(\omega_c t)$ in FIGS. 2A or 2B, the I and Q signals are readily obtained. (It is noted that frequency error of the FM signal between the transmitter and receiver are being ignored in this discussion. A constant frequency error would simply map to a d.c. bias at the output, and would not distort the demodulated output).

In analog form, I(t) and Q(t) may be expressed as:

$$I(t) = \frac{V_m}{2} \cos\left[K_P \int_{-\infty}^{t} m(\tau)d\tau\right]; \quad (6a)$$

$$Q(t) = -\frac{V_m}{2} \sin\left[K_P \int_{-\infty}^{t} m(\tau)d\tau\right]. \quad (6b)$$

With prior art FM demodulators, the message signal is recovered using:

$$Km(t) = \frac{d\alpha(t)}{dt} = \frac{d}{dt}\left(\arctan\left[\frac{Q(t)}{I(t)}\right]\right), \quad (7)$$

where $$\alpha(t) = K_P \int_{-\infty}^{t} m(\tau)d\tau. \quad (8)$$

However, as explained previously, from a processing standpoint there are disadvantages associated with computing the derivative of an arctangent function.

An alternative expression for the modulating function m(t), also employed in prior art FM demodulators, is:

$$Kpm(t) = \frac{d\alpha(t)}{dt} = \frac{I(t)\frac{dQ(t)}{dt} - Q(t)\frac{dI(t)}{dt}}{I^2(t) + Q^2(t)}. \quad (9)$$

See, for example, U.S. Pat. No. 4,910,469, issued to Takahashi, which discloses an FM demodulator generally using the approach of Eqn. (9).

From a signal processing standpoint, the Takahashi approach has the advantages of affording simple numerical operations and also, of avoiding function mapping.

When equation (9) is transformed into the digital domain, deviations from an ideal, zero distortion demodulation occur as a result of finite sample intervals. The implementation of the two differentiators dI/dt and dQ/dt is, therefore, a critical aspect of the digital demodulation process.

By using a first-order approximation to differentiation, one can obtain:

$$\frac{dI}{dt} \approx \frac{I_n - I_{n-1}}{T}, \quad (10)$$

$$\frac{dQ}{dt} \approx \frac{Q_n - Q_{n-1}}{T}$$

where T is the sampling interval between successive samples of I and Q, such as between samples $I_n$ and $I_{n-1}$. A digital solution "$R_1$" of Eqn. (9) can then be obtained as:

$$\frac{d\alpha(t)}{dt} \approx R_1 = \frac{Q_n I_{n-1} - I_n Q_{n-1}}{I_n^2 + Q_n^2} \quad (11)$$

A complete reconstruction of m(t) is realized by evaluating the variable $R_1$ for each successive pair of time samples of the I and Q signals.

Referring to FIG. 3, it is apparent that an FM signal demodulated in accordance with Eqn. (11) has an output frequency deviation $K_O$ that accurately tracks the input frequency deviation $K_I$ of the modulated FM signal only for relatively low values of $K_I$. Curve 32 shows an ideal response in which $K_O = K_I$ for all values of $K_I$, while curve 34 is a plot of $K_O$ vs. $K_I$ resulting from the approximation of Eqn. (11). In this example, a 1 kHz audio tone is frequency modulated with a peak frequency deviation $K_P$ of 12 kHz.

Figure 4:
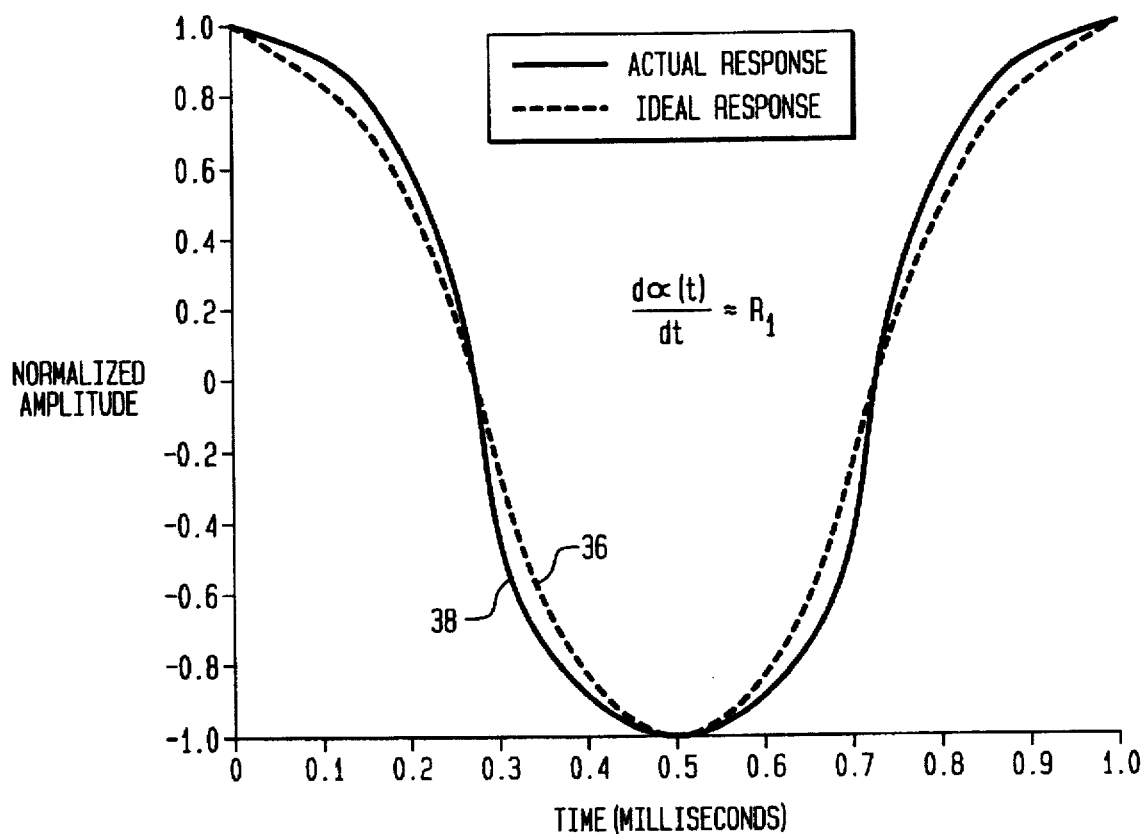

As illustrated in FIG. 4, signal compression at high frequency deviations causes signal distortion. Curve 36 illustrates an ideal demodulated audio tone. Curve 38 shows a distorted audio tone representing the demodulated signal, realized with the Eqn. (11) approach.

In accordance with a first embodiment of the present invention, the performance of the above differentiator is improved by further configuring signal processor 15 to perform the following series expansion for $\sin^{-1}(\chi)$:

$$Kpm(nT) \approx R_{1c} = R_1 + \frac{R_1^3}{6} + \frac{3R_1^5}{40} + \ldots, \quad (12)$$

where $R_1$ is known from Eqn. (11), n is an integer, and nT corresponds to the point in time in which the nth samples of I(t) and Q(t) are taken. The modulating function m(nT) then equals $R_{1c}/K_P$.

Figure 5:
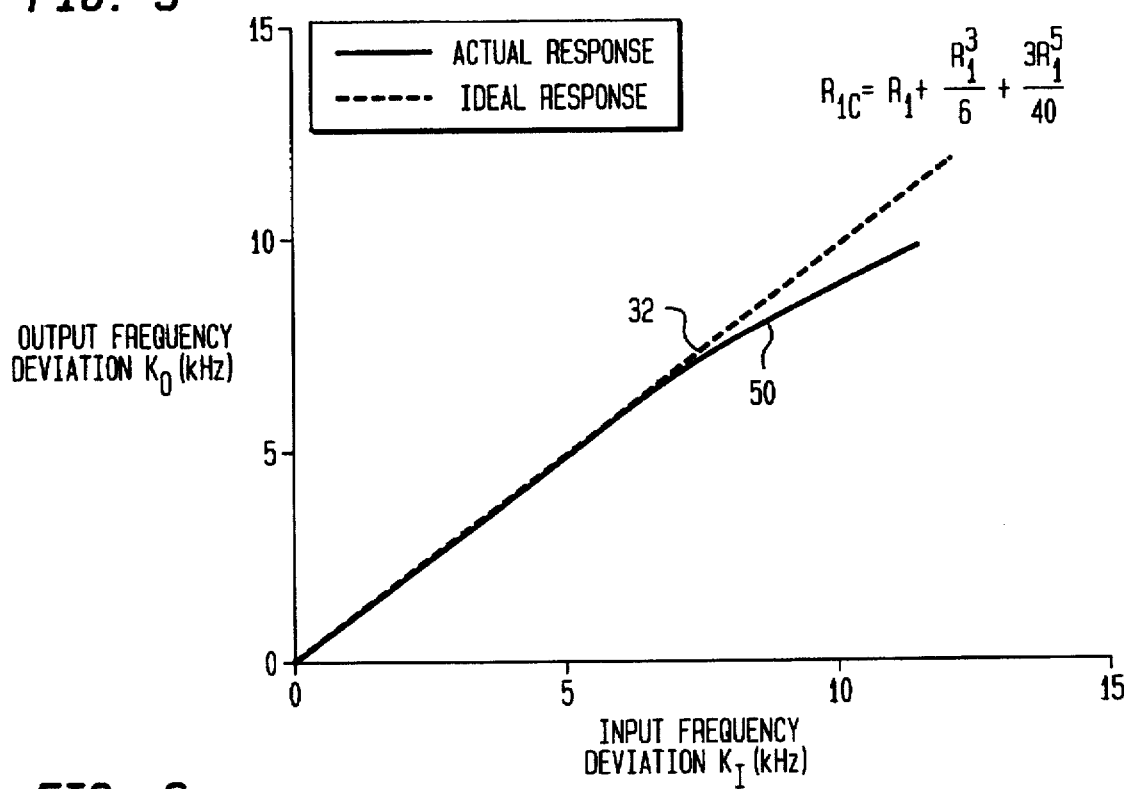
FIGS. 5–11 show performance results for various embodiments of FM demodulators in accordance with the present invention.
Figure 6:
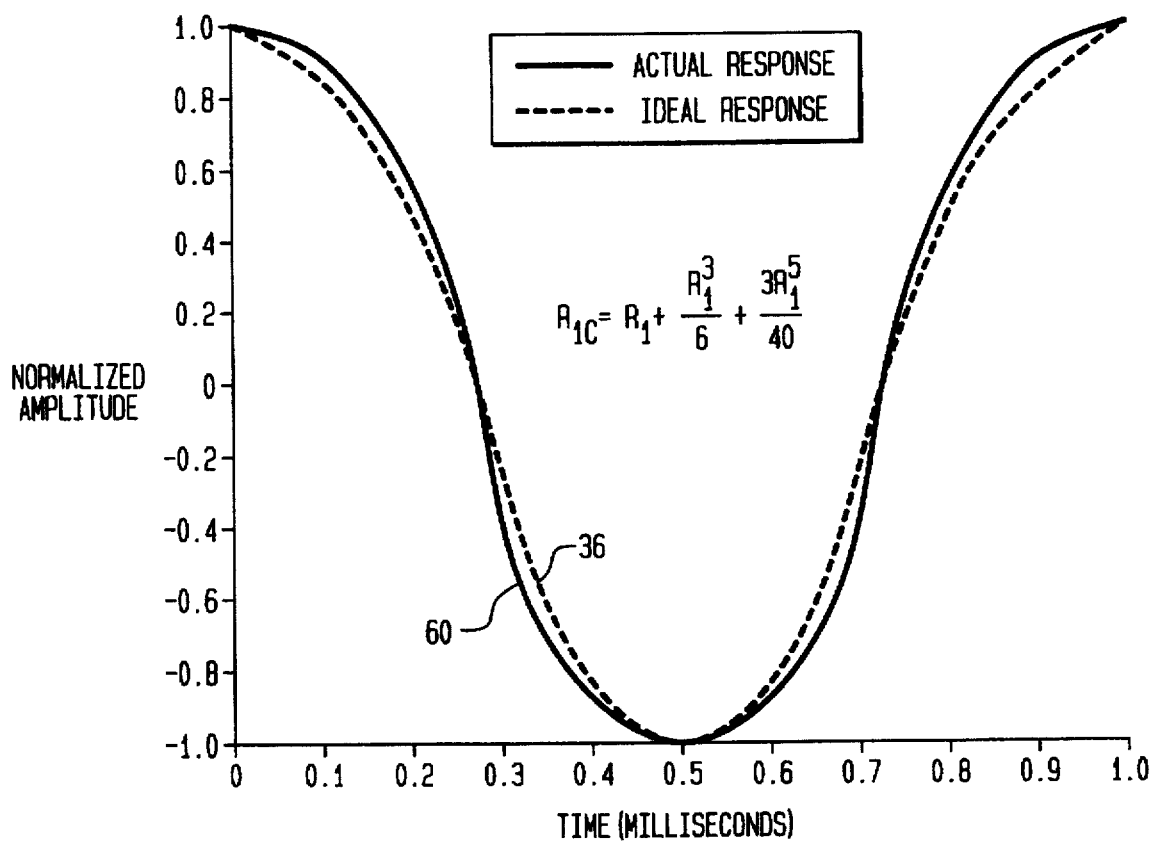

The performance improvement using only the first, third and fifth order terms of Eqn. (12) is depicted in FIGS. 5 and 6. Curve 50 of FIG. 5 shows the improved performance using the approach of Eqn. (12); curve 60 of FIG. 6 illustrates the corresponding distortion improvement. The results for FIG. 6 are for a 1 kHz tone that is frequency modulated with a peak frequency deviation $K_P$ of 12 kHz. It is understood that other values of $K_P$ can be used, depending on the application. For example, $K_P$ may be as high as 15 kHz for wireless applications with 30 kHz wide channels, or 10 kHz or lower for 25 kHz wide channels.

In accordance with an alternate embodiment of the present invention, the FM signal is demodulated with the use of Lagrangian interpolation and subsequent differentiation. With this approach, interpolation functions for Q(t) and I(t) are obtained and differentiated to yield respective derivatives Q'(t) and I'(t). These derivatives are then substituted into equation (9) to yield a more accurate representation of the modulating wave.

Lagrangian interpolation can be used to derive an expression for a function f(x) based upon knowledge of equally spaced samples $f_0, f_1, \ldots f_p$ of the function f(x).

The Lagrangian interpolation formula can be expressed as:

$$f(x) = \sum_{k=0}^{p} \frac{l_k(x)}{l_k(x_k)} f_k \quad (13)$$

where $$l_0(x) = (x-x_1)(x-x_2) \ldots (x-x_p)$$

$$l_k(x) = (x-x_0) \ldots (x-x_{k-1})(x-x_{k+1}) \ldots (x-x_p)$$

$$l_n(x) = (x-x_0)((x-x_1) \ldots (x-x_{p-1}). \quad (14)$$

Thus, for example, if a 2nd-order (m=2) Lagrangian interpolation is employed to approximate the I(t) and Q(t) components of the FM signal, then $$Q(t) = \frac{(t-t_{n-1})(t-t_n)}{(t_{n-2}-t_{n-1})(t_{n-2}-t_n)} Q_{n-2} + \quad (15)$$

$$\frac{(t-t_{n-2})(t-t_n)}{(t_{n-1}-t_{n-2})(t_{n-1}-t_n)} Q_{n-1} + \frac{(t-t_{n-2})(t-t_{n-1})}{(t_n-t_{n-2})(t_n-t_{n-1})} Q_n$$

where $Q_n, Q_{n-1}$ and $Q_{n-2}$ are the nth, (n−1)st and (n−2)nd samples of Q(t) at times $t_n, t_{n-1}$ and $t_{n-2}$, respectively, and t is a point in time between $t_{n-2}$ and $t_n$. An analogous expression can be obtained for I(t).

Differentiating Eqn. (15) and the analogous expression for I(t) to obtain derivatives dQ(t)/dt and dI(t)/dt, and substituting into Eqn. (9) yields the following expression for the modulating function m(nT):

$$K_P m(nT) = R_2 = \frac{Q_n(4I_{n-1}-I_{n-2}) - I_n(4Q_{n-1}-Q_{n-2})}{2(I_n^2+Q_n^2)} \quad (16)$$

Thus, the signal processor can employ the algorithm of Eqn. (16) to derive time samples $m(nT)=R_2/K_P$ of the modulating wave m(t), by operating on three successive samples at a time of I(t)—$I_n, I_{n-1}$ and $I_{n-2}$—and three successive samples of Q(t) at a time—$Q_n, Q_{n-1}$ and $Q_{n-2}$. A complete reconstruction of m(t) is realized by evaluating the variable $R_2$ for each successive tri-sample set—e.g., $Q_n, Q_{n-1}, Q_{n-2}$ to obtain m(nT); $Q_{n+1}, Q_n, Q_{n-1}$ to obtain m((n+1)T); and so on.

In any event, it is understood that higher order Lagrangian interpolation functions can alternatively be derived and differentiated to yield Q'(t) and I'(t), and that the invention is not limited to 2nd order Lagrangian interpolation. For example, if a 3rd-order interpolation were to be used, four consecutive samples of I(t) and four consecutive samples of Q(t) would be necessary to derive each sample of m(t).

Figure 7:
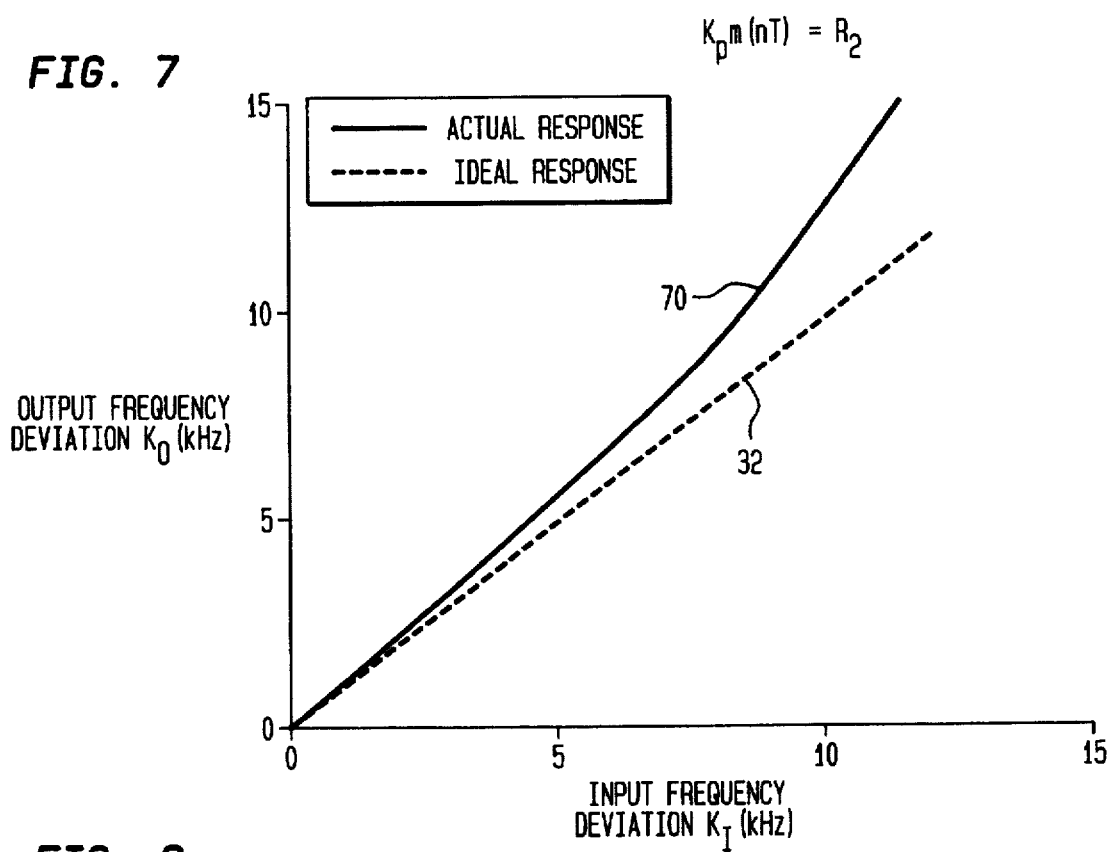

FIG. 7 depicts the performance of a FM demodulator employing the algorithm of Eqn. (16). Curve 70 shows the actual response of the demodulator as compared to the ideal response shown by curve 32. The output frequency deviation $K_O$ accurately tracks the input frequency deviation $K_I$ up to values of $K_I$ of about 3 kHz. For higher values of $K_I$, the output frequency deviation $K_O$ exceeds the desired response, producing signal expansion. Although the relative amplitude error performance is similar to that of the uncorrected first order differentiator described above in reference to FIG. 3, the signal is no longer compressed with high frequency deviations, which results in less signal distortion.

Figure 8:
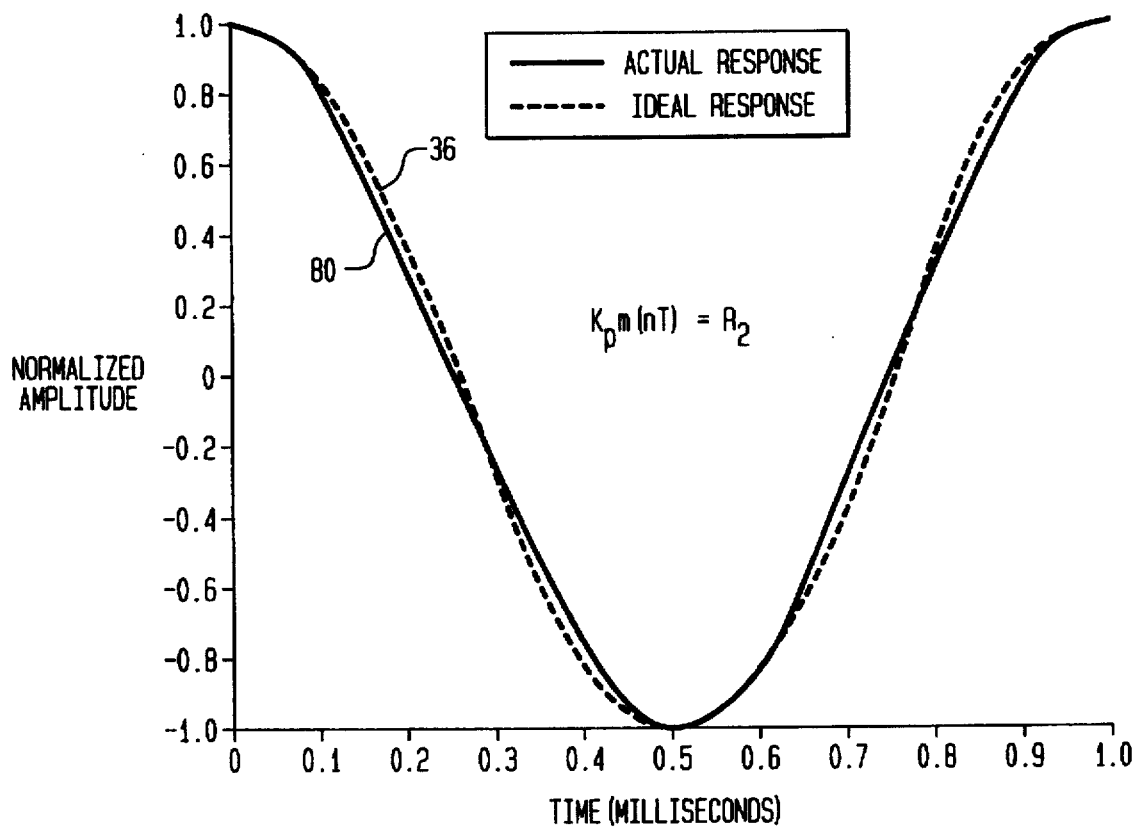

FIG. 8 depicts the resulting signal distortion of a demodulator using the approach of Eqn. (16). Curve 80 shows the actual response of a demodulated FM signal originally modulated with a 1 kHz tone, using a peak frequency deviation $K_P$ of 12 kHz, while curve 36 shows the ideal response. Signal distortion is significantly improved as compared to the uncorrected first order differentiator of FIGS. 3–4.

In accordance with another embodiment of the subject invention, the modulating wave m(t) is recovered by employing a correction factor to correct the solution $R_2$ of Eqn. (16). The correction factor is of the form:

$$R_{2C}=R_2(1-\beta|R_2|) \quad (17)$$

where β can be selected to minimize the error at a particular input frequency deviation $K_I$, or over a selected range of input frequency deviations $K_I$. Samples of the modulating wave m(t) are then obtained using $$m(nT)=R_{2C}/K_P. \quad (18)$$

Figure 9:
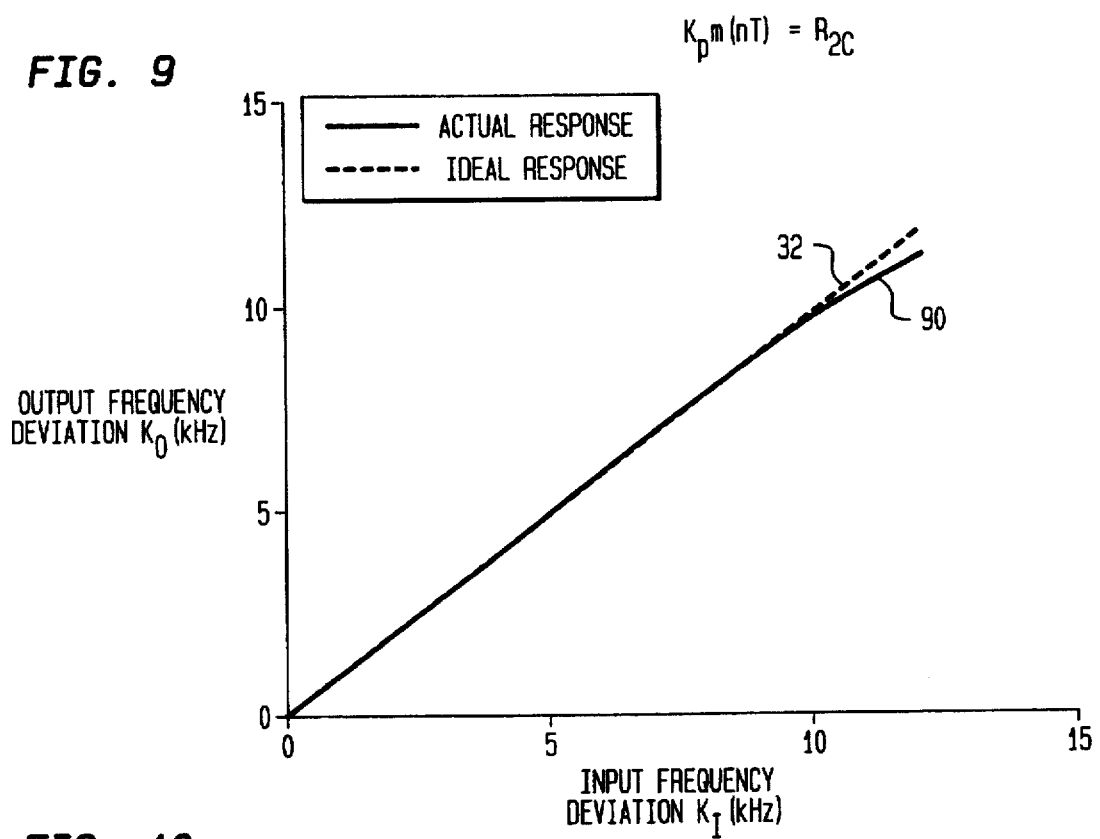
Figure 10:
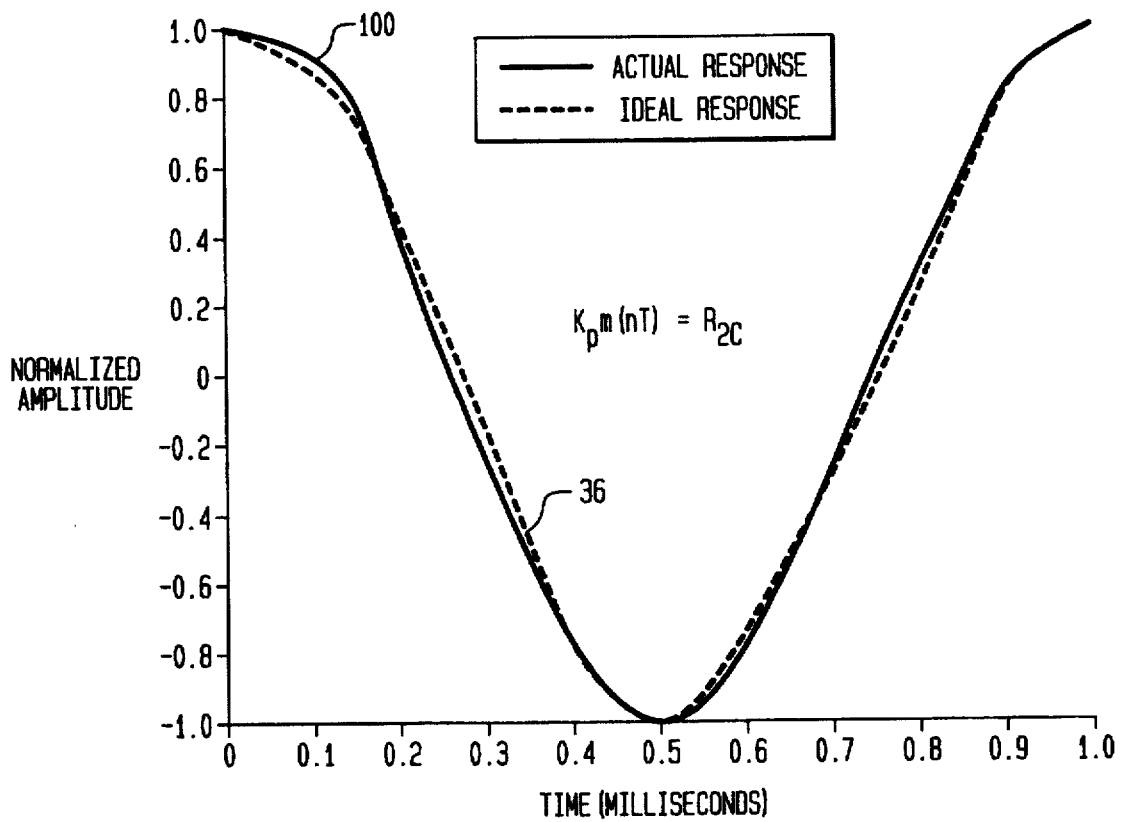

FIGS. 9 and 10 illustrate the performance of an exemplary FM demodulator that utilizes Eqns. (17) and (18) in the signal processing used for the demodulation process. In FIG. 9, the actual response of output frequency deviation $K_O$ vs. input frequency deviation $K_I$ represented by curve 90, is seen to closely track the ideal response of curve 32 up to values of $K_I$ greater than 10 kHz. This represents substantial improvement in linearity for high peak frequency deviations as compared to prior art digital FM demodulators, such as that described in reference to FIG. 3. FIG. 10 shows the actual amplitude response, curve 100, using this demodulator for a 1 kHz tone (curve 36), where the 1 kHz tone was originally modulated using a peak frequency deviation $K_P$ of 12 kHz. From the curves it is apparent that linearity is dramatically improved using this approach. It is noted that a β value of $2.46 \times 10^{-6}$ was selected in the FM demodulator to obtain the performance depicted in FIGS. 9 and 10. This value was chosen to minimize error in the derived modulating waveform m(nT) at corresponding values of $K_I$ from 5–10 kHz.

A comparison between the signal distortion of four FM demodulators, each employing a corresponding one of the four algorithms disclosed herein, is given in Table 1 below. The results are for a 1 kHz tone frequency modulated with a peak frequency deviation of 12 kHz, as discussed above. In terms of maximum amplitude error and mean square error, the corrected 2nd-order Lagrange differentiator approach (the $R_{2C}$ solution) provides superior results. Accordingly, the most preferred embodiment employs the $R_{2C}$ approach.

TABLE 1

| Algorithm | Maximum Amplitude Error (dB) | Mean Square Error with 1 kHz Tone |
|---|---|---|
| $R_1$ | −2.67 | 0.0078 |
| $R_{1c}$ | −0.94 | 0.0041 |

TABLE 1-continued

| Algorithm | Maximum Amplitude Error (dB) | Mean Square Error with 1 kHz Tone |
|---|---|---|
| $R_2$ | +3.02 | 0.0017 |
| $R_{2c}$ | −0.39 | 0.0009 |

Figure 11:
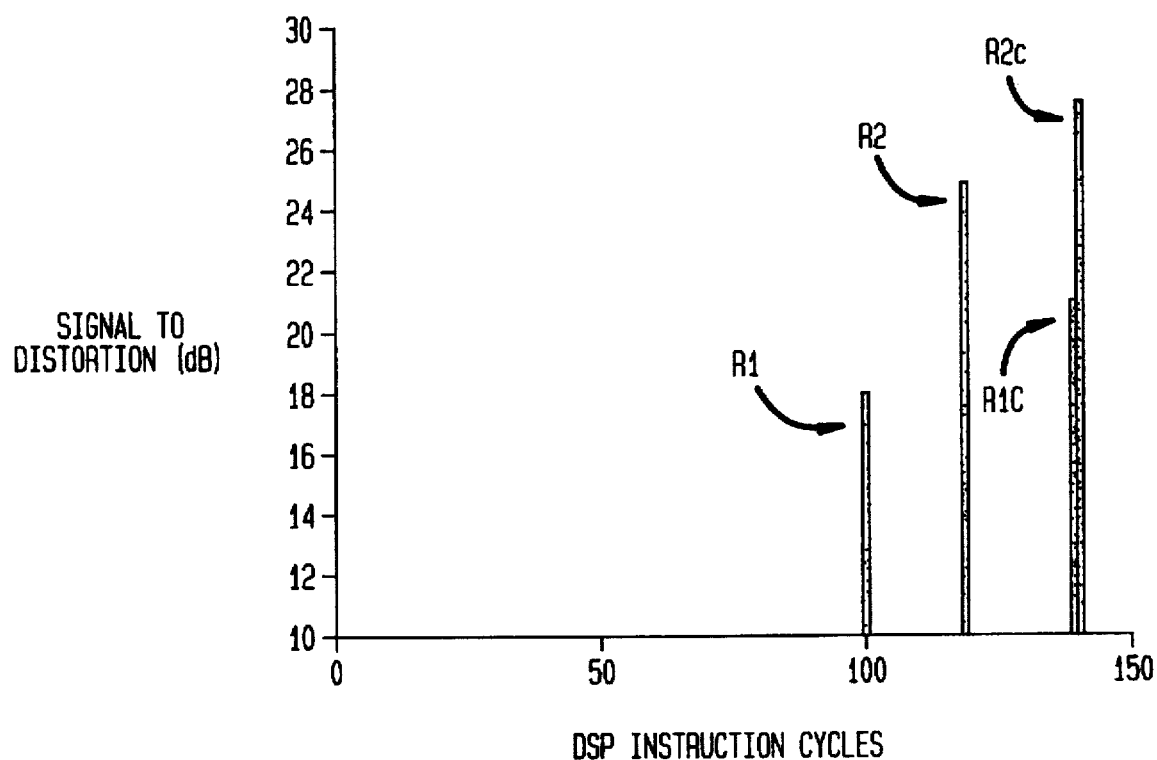

FIG. 11 depicts the signal to distortion results for each of the four FM demodulators as a function of digital signal processor (DSP) instruction cycles, for a 1 kHz tone and $K_P$=12 kHz, as before. While the computation time for the demodulator employing the $R_{2C}$ approach is approximately 41% longer than one employing the prior art $R_1$ approach, signal to distortion improves from about 18 dB to 27.5 dB. The demodulators using the $R_{1C}$ and $R_2$ solutions also significantly improve distortion while trading off computation time.

It will be understood that the embodiments disclosed herein are merely exemplary and that one skilled in the art can make many modifications and variations to the disclosed embodiments without departing from the spirit and scope of the invention. All such modifications and variations are intended to be included within the scope of the invention as defined by the appended claims.

What is claimed is:

1. A method for demodulating a frequency-modulated (FM) signal, comprising:

generating data samples of in-phase (I) and quadrature-phase (Q) components of the FM signal; and reconstructing the original modulating waveform of the FM signal from said I and Q components, using a Lagrangian interpolation function of said I and Q components.

2. The method according to claim 1, wherein said modulating waveform is derived using the following equation:

$$K_P m(nT) = \frac{I_n Q_n' - Q_n I_n'}{(I_n^2 + Q_n^2)},$$

where, n is an integer;

$I_n$ and $Q_n$ are the nth data samples of the I and Q components of the FM signal, respectively;

T is the sampling interval between successive I component samples and between successive Q component samples of the FM signal;

$I_n'$ and $Q_n'$ are the derivatives of the I and Q components, respectively, of the FM signal, at sample n;

$K_P$ is a peak frequency deviation of said FM signal; and m(nT) is the derived sample of said modulating waveform at a time corresponding to nT seconds.

3. The method according to claim 2, wherein said Lagrangian interpolation function is a second-order interpolation function, and wherein said time samples of said modulating waveform are derived using the following equation:

$$K_P m(nT) = R_2 = \frac{Q_n(4I_{n-1} - I_{n-2}) - (4Q_{n-1} - Q_{n-2})}{2(I_n^2 + Q_n^2)},$$

where, $I_{n-1}$ and $Q_{n-1}$ are the (n−1)st data samples of said I and Q components of said FM signal; and $I_{n-2}$ and $Q_{n-2}$ are the (n−2)nd data samples of said I and Q components of said FM signal.

4. The method according to claim 3, further comprising correcting said samples m(nT) of said modulating waveform by means of the following equation:

$$m(nT) = R_{2c}/K_P,$$

where $$R_{2c} = R_2(1 - \beta|R_2|),$$

where $\beta$ is a constant selected to minimize error in said modulating waveform.

5. The method according to claim 2, wherein said peak frequency deviation is in the range of about 10–15 kHz.

6. The method according to claim 1, wherein said generating data samples of I and Q components of said FM signal includes:

sampling said FM signal to provide a sampled data FM signal; and generating said data samples of said I and Q components from said sampled data FM signal.

7. The method according to claim 1, wherein said generating data samples of I and Q components of said FM signal comprises:

generating analog I and Q components of said FM signal; and sampling said analog I and Q components to generate said data samples of said I and Q components of said FM signal.

8. The method according to claim 2, wherein said FM signal is a received FM signal in a wireless telecommunications system.

9. The method according to claim 8, further comprising the step of outputting of a term $(I_n^2 + Q_n^2)$ as a received signal strength indicator (RSSI).

10. A method for demodulating a frequency modulated (FM) signal, comprising:

generating data samples of in-phase (I) and quadrature-phase (Q) components of the FM signal;

reconstructing the original modulating waveform of the FM signal from said I and Q components, using the following equation:

$$K_P m(nT) = R_1 + R_1^3/6 + 3R_1^5/40 + \ldots,$$

where, n is an integer;

T is the sampling interval between successive I component samples and between successive Q component samples of the FM signal;

m(nT) is the derived sample of said modulating waveform at a time corresponding to nT seconds;

$R_1$ is defined by the equation:

$$R_1 = \frac{Q_n I_{n-1} - I_n Q_{n-1}}{I_n^2 + Q_n^2};$$

where $I_n$ and $Q_n$ are the nth time samples of the I and Q components of the FM signal, respectively; and $I_{n-1}$ and $Q_{n-1}$ are the (n−1)st time samples of the I and Q components of the FM signal, respectively.

11. An apparatus for demodulating a frequency modulated (FM) signal, comprising:

an I and Q sampler for generating data samples of an in-phase (I) and a quadrature-phase (Q) component of the FM signal; and a signal processor for reconstructing the original modulating waveform of the FM signal from said I and Q components, using a Lagrangian interpolation function of said I and Q components.

12. The apparatus according to claim 11, wherein said signal processor is operative to reconstruct the modulating waveform using the following equation:

$$K_P m(nT) = \frac{I_n Q_n' - Q_n I_n'}{(I_n^2 + Q_n^2)},$$

where, n is an integer;

$I_n$ and $Q_n$ are the nth data samples of the I and Q components of the FM signal, respectively;

T is the sampling interval between successive I component samples and between successive Q component samples of the FM signal;

$I_n'$ and $Q_n'$ are the derivatives of the I and Q components, respectively of the FM signal, at a time corresponding to nT seconds, and based on differentiation of said Lagrangian interpolation function of respective of said I and Q data samples;

$K_P$ is a peak frequency deviation of said FM signal; and m(nT) is the derived sample of said modulating waveform at a time corresponding to nT seconds.

13. The apparatus according to claim 12, wherein said Lagrangian interpolation function is a second-order interpolation function, and wherein said signal processor is operable to derive said samples of said modulating waveform using the following equation:

$$K_P m(nT) = R_2 = \frac{Q_n(4I_{n-1} - I_{n-2}) - (4Q_{n-1} - Q_{n-2})}{2(I_n^2 + Q_n^2)},$$

where, $I_{n-1}$ and $Q_{n-1}$ are the (n−1)st data samples of said I and Q components of said FM signal; and $I_{n-2}$ and $Q_{n-2}$ are the (n-2)nd data samples of said I and Q components of said FM signal.

14. The apparatus according to claim 13, wherein said signal processor is further operable to correct said samples m(nT) of said modulating waveform by means of the following equation:

$$m(nT) = R_{2C}/K_P,$$

where $$R_{2C} = R_2(1-\beta|R_2|),$$

where β is a constant selected to minimize error in said modulating waveform.

15. The apparatus according to claim 11, wherein said I and Q sampler comprises:

an analog to digital (A/D) converter for sampling the FM signal to provide a sampled FM signal;

first and second multipliers arranged in a parallel circuit configuration for multiplying the sampled FM signal by respective of $\cos(\omega_c t)$ and $-\sin(\omega_c t)$ functions to provide first and second multiplied signals, respectively, where $\omega_c$ is a carrier frequency of the FM signal and t is time; and first and second low pass filters for filtering the respective first and second multiplied signals to provide said I and Q data samples, respectively.

16. The apparatus according to claim 11, wherein said I and Q sampler comprises:

first and second multipliers arranged in a parallel circuit configuration for multiplying the FM signal by respective of a $\cos(\omega_c t)$ and $-\sin(\omega_c t)$ function to provide first and second multiplied signals, respectively, where $\omega_c$ is the carrier frequency of the FM signal and t is time;

first and second low pass filters for filtering the respective first and second multiplied signals to provide first and second filtered signals, respectively; and first and second analog to digital (A/D) converters for sampling the respective first and second filtered signals to provide respective of said I and Q data samples.

17. The apparatus according to claim 11, wherein said signal processor is operable to provide an output signal indicative of magnitude of said FM signal.

18. The apparatus according to claim 11, further including a digital to analog (D/A) converter coupled to said signal processor for converting said samples of said modulating waveform into an analog modulating waveform of said FM signal.

19. The apparatus according to claim 18, wherein the signal processor includes a memory, said memory operable to store a complete sampled modulating waveform for subsequent D/A conversion by said D/A converter.

20. An apparatus for demodulating a frequency modulated (FM) signal, comprising:

circuit means for generating samples of in-phase (I) and quadrature phase (Q) components of the FM signal; and processing means for reconstructing the original modulating waveform of the FM signal from said I and Q components, using a Lagrangian interpolation function of said I and Q components.

* * * * *